United States Patent
Blasquez et al.

(10) Patent No.: US 9,288,483 B2
(45) Date of Patent: Mar. 15, 2016

(54) METHOD OF TESTING AN ELECTRONIC SYSTEM

(71) Applicant: AIRBUS HELICOPTERS, Marignane (FR)

(72) Inventors: Alain Blasquez, Lancon de Provence (FR); Christian Gaurel, Marseilles (FR)

(73) Assignee: AIRBUS HELICOPTERS, Marignane (FR)

( * ) Notice: Subject to any disclaimer, the term of this patent is extended or adjusted under 35 U.S.C. 154(b) by 0 days.

(21) Appl. No.: 14/633,865

(22) Filed: Feb. 27, 2015

(65) Prior Publication Data

US 2015/0249823 A1 Sep. 3, 2015

(30) Foreign Application Priority Data

Feb. 28, 2014 (FR) ..................................... 14 00509

(51) Int. Cl.
| | |
|---|---|
| *H04N 17/00* | (2006.01) |
| *G01R 31/00* | (2006.01) |
| *G01R 31/28* | (2006.01) |
| *G01R 31/36* | (2006.01) |
| *G06F 11/36* | (2006.01) |
| *G06F 11/22* | (2006.01) |

(52) U.S. Cl.
CPC ............ *H04N 17/004* (2013.01); *G01R 31/008* (2013.01); *G01R 31/2837* (2013.01); *G01R 31/3672* (2013.01); *G06F 11/22* (2013.01); *G06F 11/3672* (2013.01)

(58) Field of Classification Search
CPC ............ H04N 17/004; G01R 31/3672; G01R 11/3672; G01R 31/2837; G01R 31/008
See application file for complete search history.

(56) References Cited

U.S. PATENT DOCUMENTS

| | | | | |
|---|---|---|---|---|
| 2005/0166094 | A1* | 7/2005 | Blackwell | G06F 11/3664 714/38.14 |
| 2008/0109475 | A1* | 5/2008 | Burmester | G06F 17/2785 |
| 2009/0019311 | A1* | 1/2009 | Cahon | G01R 31/008 714/27 |
| 2009/0241076 | A1* | 9/2009 | Emek | G01R 31/318385 716/106 |
| 2009/0271351 | A1* | 10/2009 | Kandasamy | G06Q 10/00 706/47 |
| 2010/0192128 | A1* | 7/2010 | Schloegel | G06F 11/3684 717/125 |

OTHER PUBLICATIONS

French Search Report for FR 1400509, Completed by the French Patent Office on Sep. 25, 2014, 7 Pages.
Aartman et al. DASC, The 21st Digital Avionics System Conference Proceedings, Oct. 27-31, 2002, vol. 2, p. 12.E.5-1-12.E.5-11, "An independent verification tool for multi-vendor mode S airborne transponder conformance testing."
Nebut et al. IEEE Transactions on Software Engineering Mar. 2006, vol. 32, No. 3, p. 140-155, "Automatic test generation: a use case driven approach."

\* cited by examiner

*Primary Examiner* — Jefferey Harold
*Assistant Examiner* — Sean Haiem
(74) *Attorney, Agent, or Firm* — Brooks Kushman P.C.

(57) ABSTRACT

A method of testing an electronic system. During a test session of the method, a nominal test case is performed leading to at least one nominal test output being stored, and then at least one test case is performed leading to at least one test output being stored. A test memory is used to store automatically both a test difference existing between the nominal test output and the test output, and a test comparison existing between the test difference and a corresponding reference difference as determined during a reference test session.

16 Claims, 4 Drawing Sheets

METHOD OF TESTING AN ELECTRONIC SYSTEM

CROSS REFERENCE TO RELATED APPLICATION

This application claims priority to French patent application No. FR 14 00509 filed on Feb. 28, 2014, the disclosure of which is incorporated in its entirety by reference herein.

BACKGROUND OF THE INVENTION (1) Field of the Invention

The present invention relates to a method of testing an electronic system.

The term "electronic system" is used to designate a system comprising electronic and/or electrical and/or computer equipment.

(2) Description of Related Art

The electronic system may in particular be arranged on board an aircraft, and specifically a rotorcraft. In addition, an electronic system may have at least one screen suitable for displaying images that are of use to an operator, such as a pilot, for example. In the context of an aircraft, an electronic system is more specifically referred to as an "avionics" system.

The term "image" is used herein to designate a graphics representation as such, and not a numerical form for such an image, for example. Nevertheless, an image may be obtained by using its graphical representation on a screen, or by picking up its digital shape by means of a video output or a digital bus, for example.

For example, a complex system includes not only pieces of equipment, but also wired and/or wireless connections between such pieces of equipment. Such connections may comprise digital buses and also analog and/or discrete connections for passing information, such as values relating to parameters or indeed data relating to an image, for example.

Amongst this information, an electronic system makes use of input data items referred to more simply as "inputs" injected into the electronic system for processing. Furthermore, the electronic system generates output data items referred to more simply as "outputs", that may possibly be in the form of images.

By way of example, data relating to a pressure as measured by a Pitot tube may be injected into an electronic system and then processed in order to lead to a speed being displayed on a screen. The pressure then represents an input to the electronic system, whereas the image including the speed represents an output from the electronic system.

During a development stage, a manufacturer may need to test an electronic system in order to verify that the electronic system complies with specifications. The development of an electronic system may give rise to a multiple variants before the system is finalized. A manufacturer then tests these different variants in order to verify that they operate properly, and where appropriate in order to modify the electronic system. By way of example, it is possible for several tens or even several hundreds of versions to be tested before the electronic system of an aircraft is finalized.

Furthermore, a manufacturer may need to test an electronic system during production stages. The manufacturer may test each electronic system as it is fabricated and before it is put on the market.

During a test session, an electronic system may be tested by following a test procedure. The test procedure may require a plurality of distinct operating points to be detected by setting a variety of values to certain inputs of the electronic system. The term "test case" is used to designate a stable state of the electronic system obtained from certain inputs to the electronic system.

The operation of the electronic system then leads to outputs being obtained from the electronic system. These outputs can be analyzed in real time by an operator or by an automatic device for verifying that the outputs correspond to the expected outputs.

The outputs obtained may possibly be stored for subsequent analysis.

In order to test the system, one method thus suggests establishing a test case that sets values for the inputs of the system, and then verifying the behavior of the system with the help of the outputs that are obtained. A plurality of distinct test cases may be applied in order to test a variety of operating points of the system.

At each instant, the behavior of the system thus depends on the initial values of the inputs, and possibly also on how those values change once the test has started.

It can be difficult to observe the behavior of the system. For example, observing the outputs of the system may require waiting for the values of the inputs to stabilize and/or waiting for a processing time to expire.

Under such conditions, a first method consists in causing test cases to be run in interactive manner, with their results being analyzed in full by a tester operator, either during or after the tests. It is therefore necessary for an operator to be present in order to analyze all of the results.

In a second method, the test is automated.

It can be difficult to automate a test procedure.

An electronic system may make use of numerous pieces of equipment and numerous connections for passing a large amount of data, e.g. of the order of several thousand different data items.

In order to guide the development of the electronic system and the tests that need to be envisaged, the electronic system may be subdivided virtually, on a functional basis.

Each tested function is then analyzed by an operator thus working on a functional perimeter that is limited. The operator thus pays attention only to certain outputs from the electronic system, i.e. to certain items of data and/or certain portions of images. If the test is performed interactively, the operator in charge of analyzing the results takes account only of information that is pertinent for the function being tested.

Nevertheless, the test cases used for validating any one function may have effects on the behaviors of other functions. The person skilled in the art then refers to "side effects" that may influence test results. Such a side effect may be difficult to observe and to predict, in particular when the test is concentrating on a single function.

For example, a screen may display an image presenting outputs associated with a plurality of functions. Observing a portion of the image that relates to a given function does not make it possible to detect a side effect that shows up in some other portion of the image in question. Furthermore, this side effect may not be understood by an operator trained to study some other function of the system.

Furthermore, performing tests in totally automatic manner assumes that the results of one test session are compared with the results that are to be expected, without human intervention. In order to achieve this target, the results must be reproducible from one session to another.

This constraint can be difficult to satisfy.

In order to ensure that outputs are reproducible, it is appropriate to simulate changes in all of the inputs of the system in the same manner for the various test sessions. However the number of inputs to the system may be very large, thereby making the situation more complex.

The inputs may be arranged in several categories.

A first category relates to inputs that have an influence on the function under test. These inputs are under the control of the designer of the test and they may be modified if there is a change in the specifications for the function under test. This first category includes inputs that allow the function to be tested and inputs that are directly associated with the function that is to be tested.

A second category relates to inputs that, a priori, have no influence on the behavior of the function under test. The designer of a test is sometimes unconcerned by these inputs. These inputs may have values that are attributed to them implicitly by the test tools. Under such circumstances, these values may depend on the versions, configurations, and parameter settings of the test tools in use. Their influence on the outputs of the system, not associated with the function under test, may differ from one test session to another. These inputs may also be in states that are not valid, e.g. relating to connections to inputs that are disconnected or indeed to digital connections that are not powered by the test tools. These states are not necessarily under control in a complex environment.

Furthermore, an electronic system may exist in several variants or configurations that may have an influence on the outputs. Under such circumstances, if a general function of the system that is applicable to all of the variants under test, then an image may include symbols that are associated with the function under test and that differ with differing variants of the system.

Furthermore, the electronic system and the test platform may be made up of numerous pieces of equipment, and not all of them need necessarily be essential for the tests that are to be performed. The presence of these pieces of equipment and also their states, may also have an influence on certain outputs of the system.

Furthermore, changes in the specifications of the system may have an influence on its outputs.

Finally, the images generated by an electronic system may include defects that are not reproducible from one test session to another. For example, the images obtained by a camera may include spots or reflections that are not the same from one day to another.

In this context, a first automatic test method that is applicable to digital outputs seeks only to compare digital outputs with expected reference outputs.

With a system that is complex, it is difficult or even impossible to check all outputs automatically in a reasonable length of time. Under such circumstances, a first method may be limited to certain outputs only. Nevertheless, side effects, if any, are difficult to observe.

In a second automatic test method applicable to systems having graphics outputs only, the images resulting from each of the tests are automatically analyzed and compared with pre-established descriptions. That solution makes use of known methods for recognizing shapes and for comparing images. Reference may be made to the literature in order to obtain details explaining such methods.

Nevertheless, the time required for processing can be long.

Furthermore, pre-established descriptions of expected images depend on the configuration and the state of the system under test, on the environment of the test, and possibly also on the state of specifications and any changes thereto. Under such circumstances, an automatic test runs the risk of leading to results that are not reproducible.

In another method seeking to limit the above-mentioned problems of reproducibility, only those digital outputs that are associated with the function under test are examined. Under such circumstances, portions of images that do not correspond to the function are masked.

That method can require a set of masks that need to change with changing specifications of the system.

Nevertheless, side effects can be difficult to detect.

Furthermore, that method suffers from the problem of reproducibility associated with imperfections, possibly temporary imperfections, that might appear in the images.

One known document is US 2009/241076.

Also known is the document by L. J. Aartman et al.: "An independent verification tool for multi-vendor mode S airborne transponder conformance testing", 21st, DASC, The 21st Digital Avionics System Conference Proceedings, Irvine, Calif., Oct. 27-31, 2002; [Digital Aviations System Conference, New York, N.Y.: IEEE, US. Vol. 2, Oct. 27, 2002 (2002-10-27), XP010616263, ISBN: 978-0-7803-7367-9].

Also known is the document by C. Nebut et al., "Automatic test generation: a use case driven approach", IEEE Transactions on Software Engineering, Vol. 32, No. 3, Mar. 1, 2006 (2006-03-01), XP055142522, ISSN: 0098-559, DOI: 10.1109/TSE.2006.22.

BRIEF SUMMARY OF THE INVENTION

An object of the present invention is thus to propose an alternative method seeking to test an electronic system.

The invention thus relates to a method of testing an electronic system comprising a plurality of pieces of equipment and of connections between the pieces of equipment, and for example at least one piece of equipment that generates at least one image. The pieces of equipment may include pieces of electronic, electrical, or indeed computer equipment.

This method uses a test sequencer device to perform at least one test session running a test procedure comprising at least two test cases, each test case being performed by injecting into the electronic system under test at least one value for at least one simulated input parameter of the electronic system with a test performance device for picking up at least one stable output from the electronic system, the method being characterized by the following steps:

a) during a reference session:
automatically performing a test case referred to as a "nominal reference case" with the test performance device, and temporarily storing at least one output from said electronic system, referred to as a "nominal reference output" as obtained with the nominal reference case;
automatically performing at least one test case referred to as a "reference case" with the test performance device, and temporarily storing at least one output from said electronic system, referred to as a "reference output" as obtained with this reference case, and
for each reference case, storing in a reference memory a difference referred to as a "reference difference" that exists between the reference output and the nominal reference output and as determined automatically with the processor device, and associating this reference difference with a qualifier given by an operator indicating whether the reference difference corresponds to a result that is satisfactory or not satisfactory; and b) for each test session:
during a test stage, automatically performing a test case, referred to as a "nominal test case", with the test performance device and temporarily storing at least one output from said electronic system, referred to as a "nominal test output", as obtained with this nominal test case;

automatically using the test performance device to perform at least one test case, referred to as a "testing case", corresponding to a "reference case", and temporarily storing at least one output from said electronic system, referred to as a "test output", as obtained during this testing case;

during a comparison stage for each testing case:

storing in a test memory a difference, referred to as a "test difference", existing between the nominal test output and the test output and as determined automatically with the processor device; and storing in a test memory a difference, referred to as a "test comparison", existing between the test difference and the corresponding reference difference and determined automatically with the processor device; and during an analysis stage:

if for a test case the test comparison does not reveal any variation between the test difference and the reference difference, using a processor device to allocate automatically to the test difference the qualifier of the corresponding reference difference.

The invention proposes a method that acts physically on an electronic system in order to test it. By performing a plurality of comparisons, this method tends to reduce the technical difficulties associated with test conditions not being reproducible or with failure to observe certain side effects.

For each test session, two types of comparison are used.

A first type of comparison seeks to observe the variations present between the test outputs picked up during a test case of a given session and the nominal test outputs picked up during the nominal case for the session.

Each output may be an output providing the value of a parameter or defining an image. Consequently, each output may be in the form of a digital value for a parameter, an image as such, or indeed the digital form of an image displayed on a screen. An image may be an image in black or white or in color.

For each test case, it is possible for example to perform at least one subtraction between the results of the current test case and the results of the nominal case. This subtraction seeks to eliminate disturbances that are assumed to be constant during the test session. For example, a reflection present on a camera tends to be eliminated by this first type of comparison. Each test difference that is obtained then reveals only dissimilarities between the current test case and the nominal case.

A second type of comparison seeks to compare the results of two distinct test sessions. For each test case, it is possible for example to perform at least one subtraction between the test differences observed during one session and corresponding reference differences.

The term "difference" is used to designate the result of a comparison between two outputs, for example. Each difference contains information about the elements that vary from one output to another.

In the context of a parameter, if the digital value of the parameter remains constant between two compared outputs, then the stored difference does not reveal any variation, e.g. by having a digital value of zero that results from subtracting the value of the parameter on one output from the value of the same parameter on the other output under examination. Otherwise, the stored difference reveals the change that has taken place, e.g. by having a digital value that is not zero.

In the context of an image, if the image remains unchanged between two compared outputs, the stored difference does not reveal any variation, e.g. by means of an image that does not contain any visible symbol. Otherwise, the stored difference reveals the change that has taken place, e.g. by means of an image presenting symbols that vary from one image to the other.

The method does not compare absolute results between two distinct sessions, but differences obtained by the comparisons performed for each test case. For each test case, the method extracts from the results everything that is associated with the test case and only that when using the first type of comparison. The resulting information is then compared between two test sessions by using the second type of comparison.

An operator can then easily distinguish between the variations present between the outputs obtained during a test case and during a reference case. Furthermore, these variations are not reserved to one function, and can therefore reveal certain side effects.

In the context of outputs in the form of images, the method tends to be fast, because it transforms the images so as to retain only those elements that vary between images. The stored differences can be determined by comparing bits with bits or groups of bits with groups of bits.

By way of example, a prior art test of a complex electronic system performed interactively by an operator may occupy several weeks. Conversely, the method of the invention enables the electronic system to be tested over a short period, of about one day.

This method can be performed by a test system including a test sequencer device.

The test sequencer device serves to perform all of the test cases by running the successive steps of a test procedure. The test procedure may be in the form of at least one computer file obtained with a conventional test preparation device.

A conventional test sequencer device thus serves to read predefined files specifying the actions to be performed (simulating an input value, waiting times to be complied with, . . . ) and can execute them sequentially.

In order to perform automatic tests, the test sequencer device can recognize equipment control orders and trigger the associated actions. For example, the test sequencer device may:

require one or more photographs to be taken and stored in files, the file names previously being selected by an operator or being given automatically by the sequencer device or by a system for managing the storage of files;

request the modification of information displayed on a screen by issuing an order that passes through the electronic system or by means of a robot operating keys that enable the appropriate image to be selected; and/or request outputs to be stored in memories.

Such a test sequencer device may be a computer having calculation means executing programs stored in a non-volatile memory.

The test sequencer device also sends control orders to a test performance device in order to inject inputs into the electronic system, in order to act on the electronic system, and in order to pick up outputs from the electronic system.

A test performance device may then include at least one computer, cards, and/or test means receiving successive commands from the sequencer device during execution. These members respond to the commands so as to inject desired signals into the systems under test and/or so as to act physically on the electronic system, and/or so as to capture outputs of the tested system.

The electronic test means or cards may in particular take measurements on the desired signals of the system under test, store these measurements temporarily, or transmit signals or measurements to the test performance computer for storage or processing purposes.

The test system also includes a processor device for performing the required comparisons. The processor means may comprise a computer executing programs stored in a non-volatile memory.

The test sequencer device and/or the test performance device and/or the processor device may, at least in part, be in the form of software executed by one or more computers.

In order to initialize the method, a reference session is performed.

The test procedure is then run automatically with the help of the test system in order to perform a normal reference case that represents the first test case of the procedure, and then reference cases.

The nominal case of the test procedure is associated with a set of input values that act subsequently as a reference. The nominal case is, for example, selected in such a manner that all of the other test cases of the procedure give rise to outputs that differ from the nominal outputs of this nominal case.

The reference session thus makes it possible to obtain at least one nominal reference output, and at least one reference output per reference case.

The nominal reference outputs and the reference outputs that are obtained are stored.

For each test case, the processor device also determines a reference difference between each nominal reference output and the reference output, and stores this reference difference.

An expert examines the resulting reference differences and gives each of them a status. For example, a "passed" status means that the results obtained is satisfactory, while a "failed" status means that the results obtained is not satisfactory.

Thereafter, the testing of an electronic system involves performing a test session by performing a test stage proper, a comparison stage, and an analysis stage.

The test stage and the comparison stage and the test analysis stage of a test session may take place in succession and automatically, for at least one test case.

At least one of these stages performed in the context of a test case may also be performed simultaneously with performing at least one of these stages for another test case.

It is also possible in particular to perform the analysis stage, or indeed the comparison stage, in deferred manner, so as to avoid monopolizing computer resources over a long period, for example.

During the analysis stage, if the test comparison does not reveal any variation, the electronic system produces the same outputs as the reference electronic system. Under such circumstances, the processor means can automatically give the test difference the same qualifier as the corresponding reference difference.

Otherwise, several circumstances can arise.

The electronic system may need to comply with an electronic system that does not present any outputs that are not satisfactory. As a result, if the electronic system under test does not produce the same outputs as the reference electronic system, then the device may issue a warning to indicate a defect.

In contrast, the electronic system may be compared with an electronic system that does present some outputs that are not satisfactory. This situation may occur in particular during a stage of production or after a change in the electronic system, for example.

Under such circumstances, if for one test case the test comparison reveals at least one dissimilarity, this comparison may be stored in an analysis memory for processing by an operator.

The method may also include one or more of the following characteristics.

For example, if the specifications of the system have been modified, it is possible that test cases have been modified or other test cases have been added or eliminated. It is then possible to test the situations in question in an interactive mode and to monitor the outputs in order to update the reference memory by replacing old results with new results, and by adding or eliminating results.

Furthermore, if for a test case the test comparison reveals at least one variation:

if this variation corrects a known defect appearing in a reference difference that is qualified as being not satisfactory, said reference difference that is qualified as being not satisfactory may be replaced in the reference memory by the test difference that is qualified by an operator as being satisfactory;

if this variation reveals the appearance of a new defect, said reference difference that is qualified as being satisfactory may be replaced in the reference memory by the test difference that is qualified as not satisfactory; and if this variation results from a modification to the electronic system, said reference difference may be replaced in the reference memory by the test difference qualified as being "not satisfactory" or as being "satisfactory" in the judgment of an operator.

Furthermore, the reference session may be performed from a simulation of an electronic system, with all of the reference differences being then judged as being satisfactory.

In another aspect, during the test stage and between two test cases, a modification may be made solely and automatically to the value of at least one simulated input parameter as specified by the test case for performing with the help of the test performance device.

It is then possible to perform the nominal case by injecting simulated inputs into the electronic system, which inputs constitute the subject matter of tests and of non-simulated data inputs. For all other test cases of the procedure, the inputs that are not explicitly simulated conserve the values that they have had since performing the nominal case.

Furthermore, in order to determine one of the differences constituted by the "reference difference", the "test difference", and the "test comparison" between a first image and a second image, the pixels that vary from one image to another are stored pixel by pixel:

by using the processor device to determine those elements that appear on the first image and that do not appear on the second image; and by using the processor device to determine those elements that appear on the second image and that do not appear on the first image.

Certain kinds of image comparison software do not make it possible to perceive elements that disappear when performing a comparison by subtraction.

The present method thus suggests performing two subtractions between two images in order to be able to perceive elements that disappear and elements that appear when going from one image to another.

The two images resulting from the comparison may optionally be merged so that subsequent processing acts on only a single image resulting from the comparison.

Furthermore, a screen may present a symbol that varies over time.

In a variant, at least one symbol flashes on a screen during the performance of a test case, and at least three image type outputs are stored that are picked up at a predetermined frequency in order to verify the flashing.

The variation in an image may comply with specifications. For example, a screen may display a flashing symbol.

In order to test this aspect, the test performance device then takes at least three photos at a predetermined frequency, with the frequency and the number of photos depending for example on the characteristics of the flashing. The processor device then verifies, for example, that two of the three images that have been picked up do indeed present the symbol.

In an alternative, the processor device averages the images that are picked up. The resulting image shows the flashing symbol but with a color that differs from the initial color of the symbol.

In a black and white image, the flashing symbol is successively white and black in color. The average of the images picked up produces a symbol having a gray color that is easily identifiable.

This alternative may also operate with a multi-chrome image.

The variation in a symbol may be caused by instability in the environment. For example, digital data coming from an analog sensor may be displayed on a screen and its least significant digit may be unstable.

Consequently, at least one symbol may be unstable on a screen and may take a plurality of different forms during the performance of a test case, and a single image type output is stored, with the corresponding reference case comprising a plurality of reference outputs to cover all of the potential symbols.

In order to test this aspect, only one image is needed during the test. In contrast, the reference results must contain all possible images.

Furthermore, at least one symbol varies continuously on a screen during the performance of a test case, and possibly the symbol is not stored on a test output or on each corresponding reference output.

A symbol may vary in continuous manner. This applies to a clock. It may be difficult to test this type of symbol automatically without using shape recognition. This variant thus proposes eliminating the symbol from the intended process by mechanical or software masking In an alternative, at least one symbol varies continuously on a screen during the execution of a test case, and a test output is stored as occurs at a predetermined moment.

In order to verify variations in the outputs of a system in response to inputs that are static or dynamic, this variant envisages a method based on sampling the outputs.

An intermediate method consists in acting during the automatic tests to store sequences of photos or videos so as to make it possible subsequently, in deferred time, to present them to the expert who is to validate them.

If the photographs need to be taken at high frequency, it is possible to share out the workload between the real time process and the deferred processing in some other manner. In real time, the test system merely records raw images so as to defer the comparison and analysis stages.

Furthermore, when tests require images displayed on the screen to be picked up by a camera it can be difficult to ensure that they are picked up reproducibility.

Under such circumstances, when at least one test output is obtained by observing a screen, it is possible to adjust the brightness of the image prior to beginning a test session in order to obtain predetermined brightness.

For screens that possess a control that enables brightness to be set (minimum, maximum, or intermediate), it suffices to perform this adjustment at the beginning of each test session.

For screens that do not make this possible, software setting may be performed automatically using the test performance device.

Furthermore, when at least one test output is obtained by storing an image taken from a screen with the help of a camera, it is possible to position a support on said screen in order to carry the camera. The camera is then positioned in a predetermined position so as to improve the reproducibility of the tests.

Automatic comparison of images taken by a camera needs to take account of the influence of the camera as such. This characteristic seeks to optimize placement of the camera.

Certain pieces of equipment have video outputs. Under such circumstances, image capture from those outputs eliminate problems of camera positions.

When at least one test output is obtained by using a camera to store an image appearing on a screen, then before the beginning of a test session, an offset may be determined between a theoretical position of the camera and its real position, and all of the images taken with the camera may be re-framed by applying said offset thereto.

The position in vertical and horizontal translation of images taken by the camera is then adjusted automatically by the test performance device. By way of example, the following principle may be used.

The first image stored by the camera during a procedure is a test image that contains at least two predefined symbols. The positions of these symbols are searched for and compared with the desired positions that correspond to the camera being in an ideal position. The vertical and horizontal offsets that are detected between the first image and the test image are then applied to all of the images taken while the procedure is running In another aspect, at least one test output is obtained by using a camera to store an image appearing on the screen, and a mask is arranged on said screen.

A mask fastened to the screen and encompassing the camera is used to eliminate reflections and shadows.

Furthermore, one of the following differences "reference difference", "test difference", and "test comparison" is obtained by comparing a first image with a second image, and said difference may be filtered with the processor device by eliminating lines having a thickness of one pixel.

Framing errors associated with the positioning of a camera may for example of the order of at most one pixel in translation between two test sessions when using the variants that seek to minimize these errors. These errors can generate a line having a thickness of one pixel in an image representing one of said differences. Such a line can be eliminated by conventional software filtering.

This feature of tested images is also used when making comparisons between test sessions. If the dissimilarities between images coming from two test sessions are very small and limited to a few pixels, these dissimilarities may not be representative of any problem in the system. Use is then made of a detection threshold that makes it possible to eliminate such false "detections" associated with the imperfections of the image-taking process.

Furthermore, it is possible to control at least one piece of equipment during the performance of a test case, either by injecting an order into the electronic system with the test sequencer computer, or else by controlling a robot to physically manipulate an interface of said equipment.

The pieces of the electronic equipment that include screens may be controlled by digital connections containing page-change commands or display type commands.

With a piece of equipment that does not have this ability but that requires knobs to be manipulated, the test performance device may include a robot that is controlled by the test sequencer device.

BRIEF DESCRIPTION OF THE SEVERAL VIEWS OF THE DRAWINGS

The invention and its advantages appear in greater detail from the context of the following description of examples given by way of illustration and with reference to the accompanying figures, in which.

Elements that are present in more than one of the figures are given the same references in each of them.

DETAILED DESCRIPTION OF THE INVENTION

Figure 1:
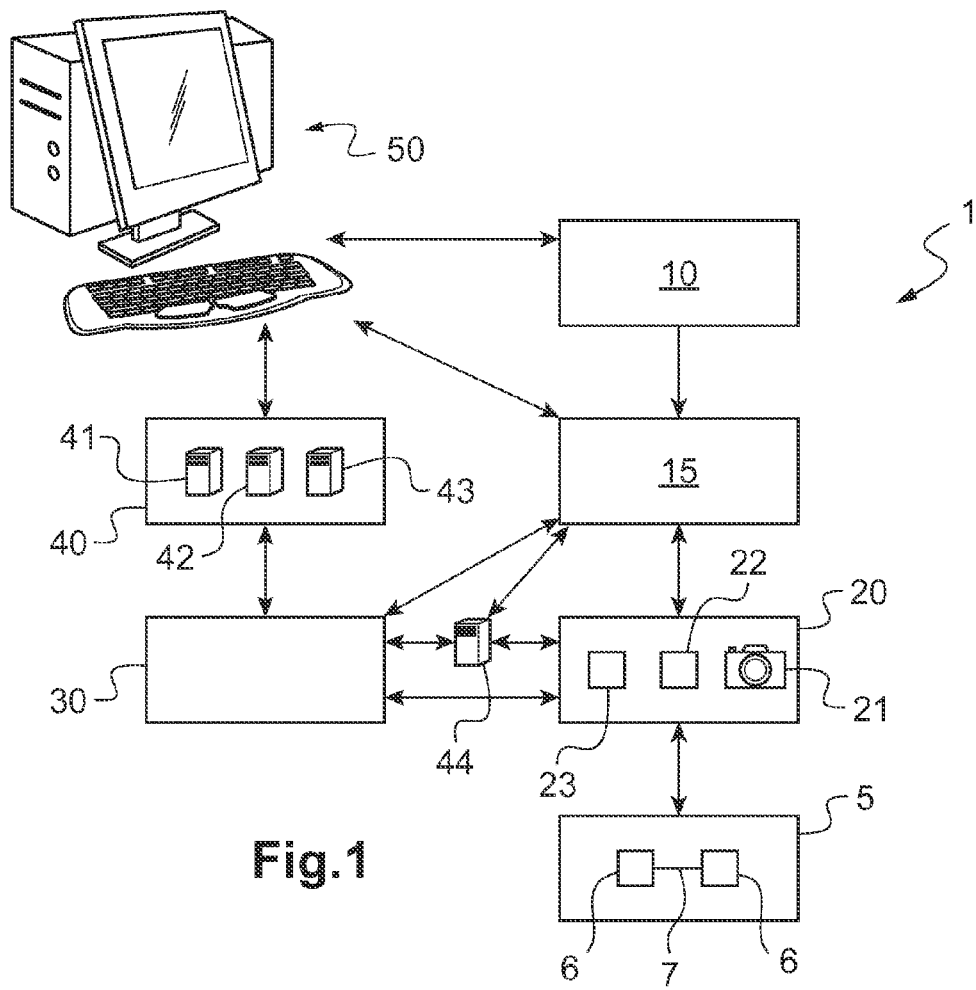
FIG. 1 shows a test system of the invention.

FIG. 1 shows an electronic system 5 having a plurality of pieces of equipment 6 together with connections 7. The electronic system 5 may be a complex system for an aircraft, by way of example.

FIG. 1 also shows a test system 1 for testing the operation of the electronic system 5, both during a stage of developing the electronic system 5 and during a stage of producing it.

The test system 1 applies the method of the invention for this purpose.

The test system includes a test sequencer device 15 for acting during a test session to cause the various steps described in a test procedure to be performed. The test procedure may be specified in detail in one or more computer files stored in a non-volatile memory, e.g. a memory of the test sequencer device.

Consequently, the test system 1 may comprise a conventional test separation device 10 for generating the various files describing a test procedure and for use by the test sequencer device.

An operator may use conventional computer means 50 for modifying a test procedure, e.g. in the event of the electronic system changing.

Furthermore, the test system 1 includes a test performance device 20 that is connected firstly to the test sequencer device and secondly to the electronic system 5.

The test performance device 20 may comprise at least one acquisition means 21 for picking up image type outputs during a test. Such acquisition means 21 may comprise:

a first digital camera producing a digital image of a screen each time a pertinent command is received from the test sequencer device;

a digital camera producing a succession of digital screen images on each pertinent command received from the test sequencer device;

a video acquisition system producing a digital video image or a succession of digital video images on each pertinent command received from the test sequencer device; and a bus receiver producing a digital bus image on each pertinent command received from the test sequencer device.

Figure 2:
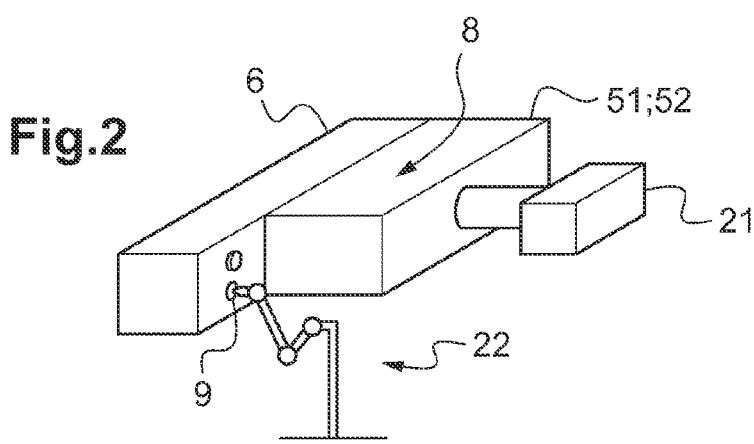
FIG. 2 is a diagram showing a support for a camera with a mask and a robot of a test performance device.

With reference to FIG. 2, acquisition means of the still or moving camera type may be positioned facing a screen 8 of a piece of equipment in order to take the required photographs or videos.

For this purpose, a support 51 may be fastened around the screen. The acquisition means are then fastened to the support in order to be positioned in appropriate and reproducible manner.

Furthermore, a mask 52 may be arranged around the screen in order to avoid reflections, for example.

In the embodiment of FIG. 2, the support 51 also acts as a mask.

FIG. 2 also shows diagrammatically a robot 22 suitable for operating the controls 9 of a piece of equipment.

Figure 14:
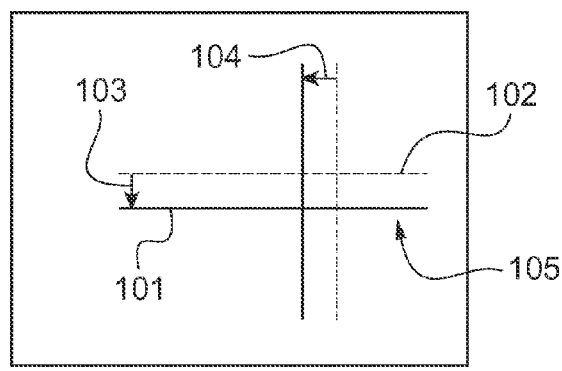
FIG. 14 is a diagram showing software re-framing of images picked up with a camera.

With reference to FIG. 14, prior to performing a test procedure, the test sequencer device may determine whether acquisition means are correctly calibrated.

For example, the test sequencer device may require the display of a symbol 105, e.g. such as a cross. The test sequencer device can then request the test performance device to determine a lateral offset 104 and an elevation offset 103 between the position of the cross 102 as picked up by the acquisition means and a theoretical position for the cross 101. All of the images picked up by the acquisition means are re-framed by the processor device 30, e.g. by using determined offsets.

Re-framing may also be undertaken in order to take account of an angular offset and/or a longitudinal offset depending on the distance between the acquisition means and the observed symbol. Such offsets result from the position of the acquisition means relative to a screen.

With reference to FIG. 1, the test performance device 20 may also include at least one robot 22 for manipulating at least one button of a piece of equipment.

Finally, the test performance device 20 may include at least one card and equipment suitable for injecting the value of an input into the electronic system and for picking up at least one output.

Furthermore, the test system 1 is provided with a processor device 30 capable of communicating with the test performance device 20 directly or indirectly via a buffer memory 44 of a storage system 40, and with the test sequencer device 15.

The processor device 30 may communicate with a storage system 40 that may include a reference memory 41, a test memory 42, and an analysis memory 43.

Under such circumstances, the processor device 30 receives the outputs picked up by the test performance device and processes them appropriately by applying the method of the invention.

In this method, a manufacturer performs a "reference session" test session in order to establish a reference database that is stored in the reference memory 41.

During this reference session, the test sequencer device 15 performs instructions relating to a nominal reference case, also known as an "initial reference case".

For this purpose, the test sequencer device 15 transmits orders to the test performance device 20 in order to operate the electronic system under conditions for the nominal test case. For example, the test performance device injects inputs into the electronic system.

For example, the test performance device injects predetermined values for parameters into the electronic system, such as the value of a pressure parameter, for example.

Furthermore, the test performance device may require a predetermined page to be displayed on a screen of a piece of equipment, e.g. by making use of a robot 22.

The test performance device also picks up the outputs generated by the electronic system 5. When at least one test output is obtained by observing a screen 8, it is possible to adjust the brightness of the image and/or the position of acquisition means 21 before starting a test session.

These outputs may be in the form of parameter values and/or of images.

The outputs picked up during performance of the nominal reference case are referred to by analogy as "nominal reference outputs" or "initial reference outputs". These nominal reference outputs are stored, at least temporarily, e.g. in the buffer memory 44.

Figure 3:
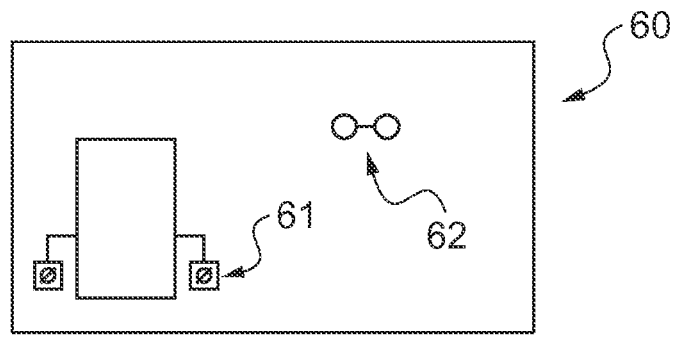
FIGS. 3 to 5 are views showing the performance of a reference session.

FIG. 3 shows an image as input representing such a nominal reference output 60. In particular, this image shows a first symbol 61 in the form of a square having a crossed-out circle therein, and a second symbol 62 in the form of two circles connected together by a line. The first symbol and the second symbol relate to two distinct functions, which functions are nevertheless both displayed on the same screen.

A reference test session also makes provision for performing other cases, referred to as "reference test cases" or "subsequent reference cases".

At the end of performing the nominal test case, the test sequencer device requires new inputs to be injected for testing each reference test case.

By way of example, the test sequencer device may request solely the modification of the value of at least one input parameter that is simultaneously being specified by the test case that is to be performed. In other words, non-simulated input parameters conserve their current values.

The test performance device picks up the outputs generated by the electronic system 5 while performing each reference test case. These outputs are referred to by analogy as "reference outputs" or "subsequent reference outputs" and they are stored, at least temporarily, e.g. in the buffer memory 44.

Figure 4:
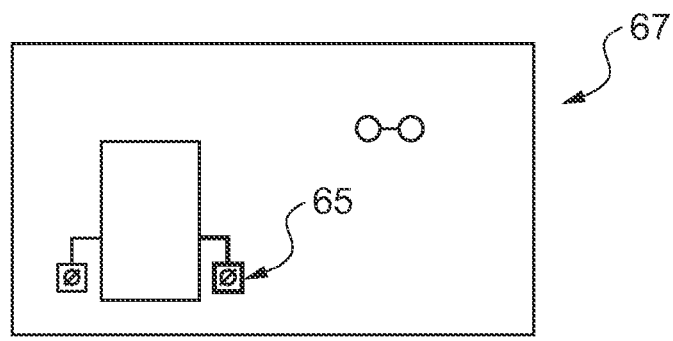

FIG. 4 shows an image representing such a reference output 67, this image being input while performing a test case seeking to test the function associated with the first symbol. This image shows the second symbol 62 and shows the influence of the test case in particular by presenting a third symbol 65 that corresponds to the first symbol 61 but that is now in the form of bold lines.

For each test case, the processor device is used during an analysis step. An analysis step may be performed directly after performing a reference test case. In another alternative, all of the analysis steps are performed directly after performing all of the test cases, or else in deferred time.

For each test case, the analysis step consists in comparing each reference output 67 with a nominal reference output 67 in order to store elements that vary between these outputs.

More precisely, the processor device determines a "reference difference" which represents the difference that exists between the reference output 67 and the nominal reference output 60, and stores it in the reference memory.

Figure 5:
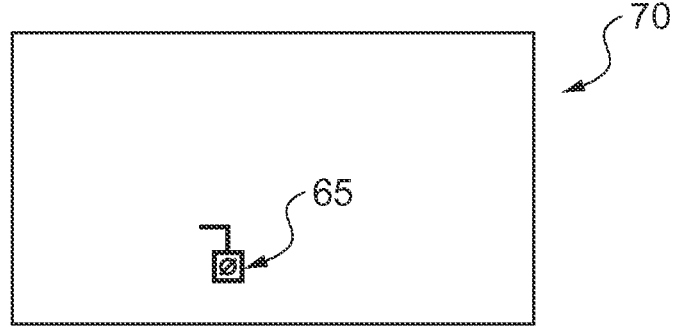

FIG. 5 shows the stored reference difference 70 that results from comparing the reference output 67 of FIG. 4 with the nominal reference output of FIG. 3.

This reference difference 70 shows only the third symbol 65.

In the context of images, it is possible to filter the image corresponding to the reference difference.

An operator associates this reference difference 70 with a qualifier indicating whether the reference difference corresponds to a result that the operator judges to be satisfactory or not satisfactory.

For example, the reference session may be performed from a simulation of an electronic system. All of the reference differences may then be judged satisfactorily.

In the method, another electronic system is then tested during a session referred to as a "test session".

For each test session, the test system 1 is used in order to perform a test stage, a comparison stage, and an analysis stage.

During the test stage, the test sequencer device performs the same test procedure as the test procedure that is being used as a reference.

Under such circumstances, the test stage requires a nominal case to be tested that is referred to for this stage as the "nominal test case", also known as the "initial test case", in order to distinguish it from the nominal reference case, and at least one test case referred to for this stage as the "testing case" or "subsequent test case" in order to distinguish it from the "reference cases".

Figure 6:
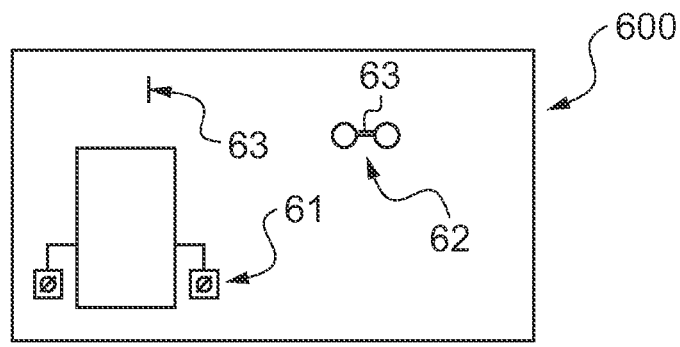
FIGS. 6 to 7 are views showing the performance of a stage of testing a test session.

FIG. 6 shows an input image representing a nominal test output 600, also known as an initial test output, picked up during the nominal test case.

This image shows in particular the first symbol 61 and the second symbol 62. The image also shows imperfections 63.

Figure 7:
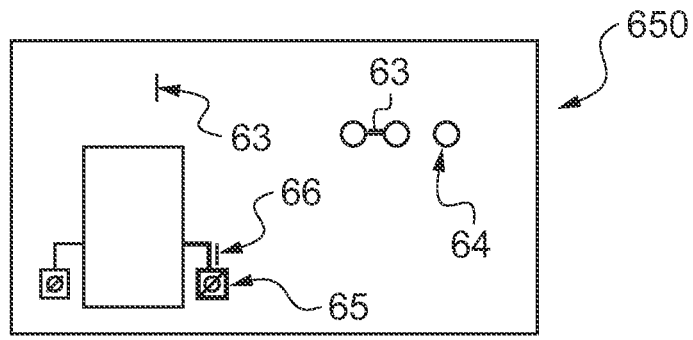

FIG. 7 shows an input image representing a test output 650, also known as a subsequent test output, as picked up during a testing case.

This image shows in particular the third symbol 65, the second symbol 62, and imperfections 63.

Furthermore, the image shows a new line 66 and a fourth symbol 64.

The outputs picked up during the test stage are stored at least temporarily in a memory, e.g. the buffer memory 44.

The comparison stage is then performed by the processor device 40 on an order from the test sequencer device or from an operator in the event of treatment being deferred.

The processor device determines a difference referred to as a "test difference" that exists between the nominal test output 600 and the test output 650, and stores this difference in the test memory 42.

Figure 8:
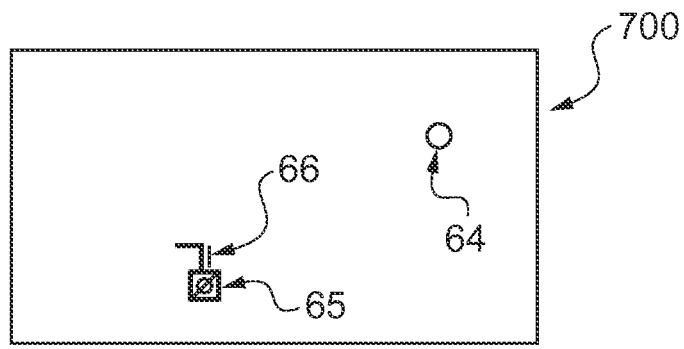
FIGS. 8 to 10 are views showing the performance of a stage of comparing a test session.

With reference to FIG. 8, this test difference 700 thus shows the third symbol 65, the line 66, and the fourth symbol 64. This test difference 700 thus serves to eliminate the imperfections 63 so as to show only the influence of the test case.

The results as stored for each testing case N thus represent the variations, if any, between the outputs for testing case N and the corresponding outputs for the first test case of the procedure, i.e. the nominal case.

If a digital variable V has the same value for the testing case N and for the first test case, it is possible to avoid storing anything in order to avoid overloading the memories.

Figure 9:
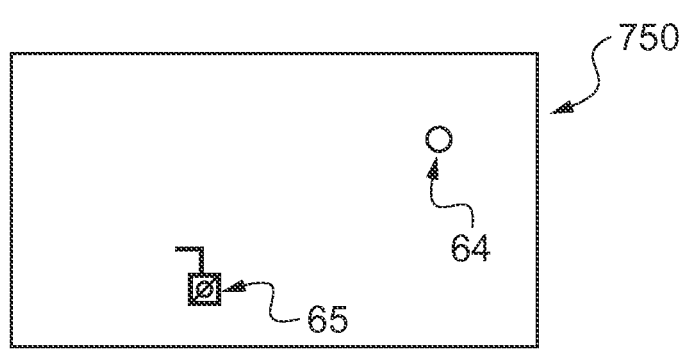

With images, it is possible to filter an image corresponding to the test difference. For example, each isolated line having a thickness of one pixel is eliminated. This filtering may serve, for example, to eliminate the line 66 in the example of FIG. 9.

Furthermore, for each test difference, the processor device determines another difference referred to as a "test comparison" that exists between the test difference 700 under examination and the corresponding reference difference 70 and stores it in the test memory 42. With images, it is possible to filter the image corresponding to the test comparison.

Figure 10:
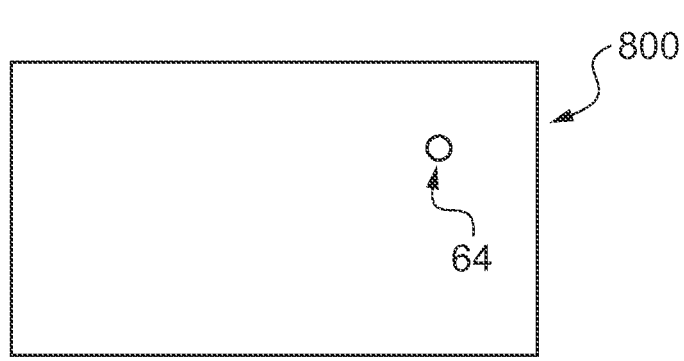

FIG. 10 shows the image in the present example that corresponds to the test comparison. This comparison shows only the fourth symbol 64.

This fourth symbol has nothing to do with the function being tested by performing the test case under consideration. Its presence in the test comparison may thus illustrate the presence of a side effect, for example.

Under such conditions, the test comparison seeks to verify a version of the electronic system relative to reference results obtained with a preceding version and to do so by using the same test procedures.

During an analysis stage, if the test comparison does not reveal any dissimilarity in a test case, then the processor device can automatically allocate to the test difference 700 the qualifier for the corresponding reference difference.

Otherwise, a warning may be generated and/or the test comparison may be stored in an analysis memory for subsequent analysis.

Under such circumstances, the method makes it possible to perform a test quickly and use a dedicated space for storing any tests that raise potential problems. A testing operator then has no need to monitor all of the results produced during the test.

If the test comparison for a test case reveals at least one dissimilarity, several scenarios can be envisaged.

For example, if the dissimilarities revealed correct a known defect that appears in a reference difference qualified as being not satisfactory, the operator may replace in the reference memory said reference difference that is qualified as being non-satisfactory by the test difference that is qualified as being satisfactory.

If this dissimilarity reveals the appearance of a new defect, then the operator replaces in the reference memory said reference difference that is qualified as being satisfactory with the test difference that is qualified as being not satisfactory.

If this dissimilarity results from a modification to the electronic system, then the operator replaces in the reference memory said reference difference with the test difference that is qualified as being "not satisfactory" or as being "satisfactory" depending on the judgment of an operator.

These steps may possibly be automated, particularly if the specifications of the electronic system have not changed.

Figure 11:
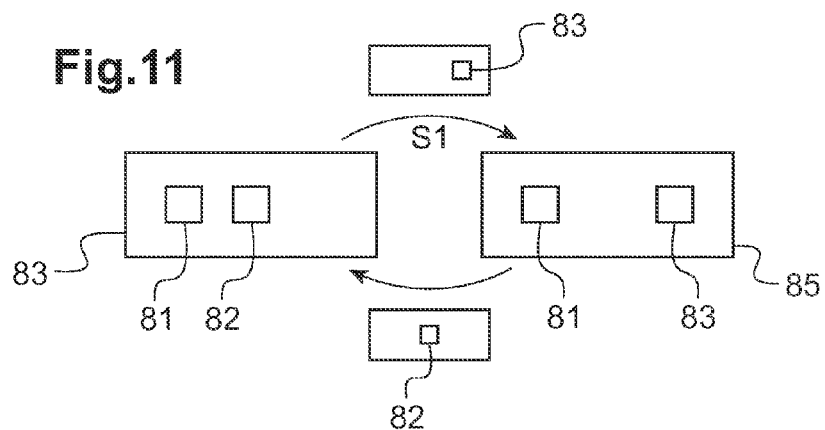
FIG. 11 is a diagram showing the comparison of two images performed by two subtractions.

With reference to FIG. 11, in order to determine a "reference difference" or a "test difference" or a "test comparison" between a first image 80 and a second image 85, the processor device may proceed by performing two subtractions.

For example, the first image 80 may have a left symbol 81 and a central symbol 82, whereas the second image has a left symbol 81 and a right symbol 83.

By subtracting the second image from the first image in a first subtraction S1, an image is obtained presenting the right symbol 83.

By subtracting the first image from the second image in a second subtraction S2, an image is obtained presenting the central symbol 82.

Thus, the processor device 30 updates the central symbol 82 appearing in the first image and not appearing in the second image, and the right symbol 83 appearing in the second image and not appearing in the first image.

Figure 12:
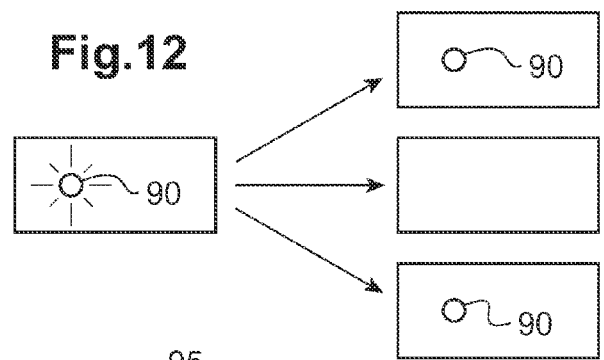
FIG. 12 is a diagram showing the processing of the display of a flashing symbol on a screen.

With reference to FIG. 12, an output may include a symbol 90 that is flashing on a screen.

While performing a test case, the test performance device then stores at least three image type outputs picked up at a predetermined frequency in order to verify this flashing. For example, two of the three outputs picked up must present the symbol 90. It can thus be understood that all three outputs corresponding to the three expected outputs are then stored in the reference memory.

Figure 13:
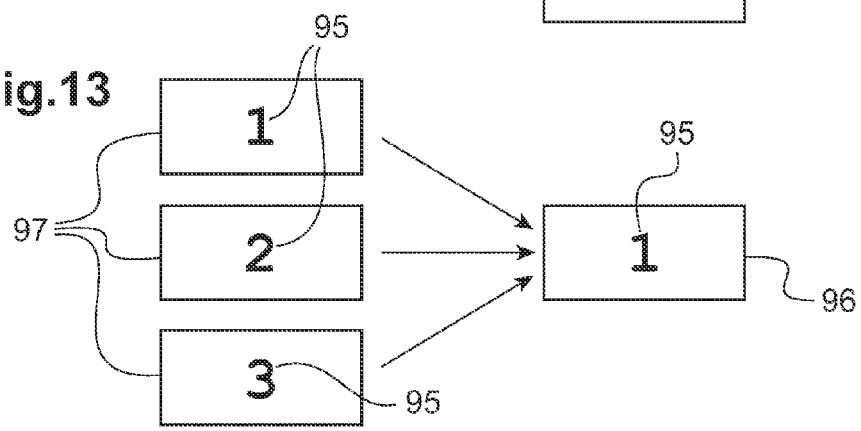
FIG. 13 is a diagram showing the processing of the display of a symbol on a screen, which symbol can present a plurality of distinct values.

With reference to FIG. 13, an output may include a symbol 95 that is not stable on a screen and that may take on a plurality of different forms, e.g. the form of the digits 1, 2, and 3 in the example shown diagrammatically. The reference memory is then used to store all of the possible reference outputs 97.

While performing a test case, a single image type output 96 is stored that is subsequently compared with the stored reference outputs 97.

Furthermore, when at least one symbol changes continuously on a screen, the symbol may either be ignored by being physically masked or by being masked in software by means of a filter, or else a test output may be stored as produced at a predetermined moment in order to be able to compare the test output with an expected output.

Naturally, the present invention may be subjected to numerous variations as to its implementation. Although several implementations are described, it will readily be understood that it is not conceivable to identify exhaustively all possible implementations. It is naturally possible to envisage replacing any of the means described by equivalent means without going beyond the ambit of the present invention.

What is claimed is:

1. A method of testing an electronic system having a plurality of pieces of equipment and connections between these pieces of equipment, the method using a test sequencer device to perform at least one test session running a test procedure comprising at least two test cases, each test case being performed by injecting into the electronic system under test at least one value for at least one simulated input parameter of the electronic system with a test performance device for picking up at least one stable output from the electronic system, the method having the following steps:

a) during a reference session:
   automatically performing a test case referred to as an "initial reference case" with the test performance device, and temporarily storing at least one output from the electronic system, referred to as an "initial reference output" as obtained with the initial reference case;
   automatically performing at least one test case referred to as a "subsequent reference case" with the test performance device, and temporarily storing at least one output from the electronic system, referred to as a "subsequent reference output" as obtained with this subsequent reference case, and
   for each subsequent reference case, storing in a reference memory a difference referred to as a "reference difference" that exists between the subsequent reference output and the initial reference output and as determined automatically with a processor device, and associating this reference difference with a qualifier given by an operator indicating whether the reference difference corresponds to a result that is satisfactory or not satisfactory; and b) for each test session:
   during a test stage, automatically performing a test case referred to as an "initial test case", corresponding to the initial reference case, with the test performance device, and temporarily storing at least one output from the electronic system, referred to as an "initial test output" as obtained with this initial test case;

automatically using the test performance device to perform at least one test case, each referred to as a "subsequent test case", corresponding to a "subsequent reference case", and temporarily storing at least one output from the electronic system, referred to as a "subsequent test output" as obtained during this subsequent test case;

during a comparison stage for each subsequent test case:
storing in a test memory a difference referred to as a "test difference", existing between the initial test output and the subsequent test output and as determined automatically with the processor device; and
storing in a test memory a difference referred to as a "test comparison" existing between the test difference and a corresponding reference difference and determined automatically with the processor device; and during an analysis stage:
if for a test case the test comparison does not reveal any variation between the test difference and the reference difference, using the processor device to allocate automatically to the test difference the qualifier of the corresponding reference difference.

2. A method according to claim 1, wherein if for a subsequent test case the test comparison reveals at least one variation:
if this variation corrects a known defect appearing in a reference difference that is qualified as being not satisfactory, the reference difference that is qualified as being not satisfactory is replaced in the reference memory by the test difference that is qualified by an operator as being satisfactory;
if this variation reveals the appearance of a new defect, the reference difference that is qualified as being satisfactory is replaced in the reference memory by the test difference that is qualified as not satisfactory; and
if this variation results from a modification to the electronic system, the reference difference is replaced in the reference memory by the test difference qualified as being "not satisfactory" or as being "satisfactory" in the judgment of an operator.

3. A method according to claim 1, wherein the reference session is performed from a simulation of an electronic system, with all of the reference differences being judged as being satisfactory.

4. A method according to claim 1, wherein each output is an output providing the value of a parameter or defining an image.

5. A method according to claim 1, wherein during the test stage and between two test cases, a modification is made solely and automatically to the value of at least one simulated input parameter as specified by the test case for performing with the help of the test performance device.

6. A method according to claim 1, wherein in order to determine one of the differences constituted by the "reference difference", the "test difference", and the "test comparison" between a first image and a second image, pixels that vary from one image to another are stored pixel by pixel:

by using the processor device to determine those elements that appear on the first image and that do not appear on the second image; and
by using the processor device to determine those elements that appear on the second image and that do not appear on the first image.

7. A method according to claim 1, wherein at least one symbol flashes on a screen during the performance of a test case, and at least three image type outputs are stored that are picked up at a predetermined frequency in order to verify the flashing.

8. A method according to claim 1, wherein at least one symbol is unstable on a screen and may take a plurality of different forms during the performance of an initial test case or subsequent test case, and a single image type output is stored, with the corresponding initial reference case or subsequent reference case comprising a plurality of reference outputs to cover all of the potential symbols.

9. A method according to claim 1, wherein at least one symbol varies continuously on a screen during the performance of an initial test case or subsequent test case, and the symbol is not stored on the initial test output or subsequent test output or on each corresponding initial reference output or subsequent reference output.

10. A method according to claim 1, wherein at least one symbol varies continuously on a screen during the execution of an initial test case or subsequent test case, and the initial test output or subsequent test output is stored as occurs at a predetermined moment.

11. A method according to claim 1, wherein at least one initial test output or subsequent test output is obtained by observing a screen, and the brightness of the image is adjusted before the beginning of a test session.

12. A method according to claim 1, wherein at least one initial test output or subsequent test output is obtained by storing an image appearing on a screen with the help of a camera, and a support is positioned on the screen in order to carry the camera.

13. A method according to claim 1, wherein at least one initial test output or subsequent test output is obtained by using a camera to store an image appearing on a screen, and before the beginning of a test session, an offset is determined between a theoretical position of the camera and its real position, and then all of the images taken with the camera are re-framed by applying the offset thereto.

14. A method according to claim 1, wherein at least one initial test output or subsequent test output is obtained by using a camera to store an image appearing on the screen, and a mask is arranged on the screen.

15. A method according to claim 1, wherein one of the following differences "reference difference", "test difference", and "test comparison" is obtained by comparing a first image with a second image, and the difference is filtered with the processor device by eliminating lines having a thickness of one pixel.

16. A method according to claim 1, wherein at least one piece of equipment is controlled during the performance of a test case, either by injecting an order into the electronic system with the test sequencer computer, or else by controlling a robot to physically manipulate an interface of the equipment.

* * * * *